United States Patent [19]

Heyke et al.

[11] 4,314,271
[45] Feb. 2, 1982

[54] TWO SEMICONDUCTOR DIODE RECTIFIER STRUCTURE

[75] Inventors: Klaus Heyke; Günter Schmidt, both of, Reutlingen; Istvar Ragály, Schwieberdingen, all of Fed. Rep. of Germany

[73] Assignee: Robert Bosch GmbH, Stuttgart, Fed. Rep. of Germany

[21] Appl. No.: 114,836

[22] Filed: Jan. 24, 1980

Related U.S. Application Data

[63] Continuation of Ser. No. 903,909, May 8, 1978, abandoned.

[30] Foreign Application Priority Data

Jul. 30, 1977 [DE] Fed. Rep. of Germany ....... 2734571

[51] Int. Cl.³ ................... H01L 23/32; H01L 23/02; H01L 23/12
[52] U.S. Cl. ........................ 357/76; 357/74; 357/79; 357/81
[58] Field of Search ............. 357/72, 74, 75, 76, 357/79, 81

[56] References Cited

U.S. PATENT DOCUMENTS

| | | | |
|---|---|---|---|
| 2,516,344 | 7/1950 | Ross et al. ......................... | 357/72 |
| 3,179,855 | 4/1965 | Brombaugh ....................... | 357/79 |
| 3,183,407 | 5/1965 | Yasuda et al. ..................... | 357/75 |
| 3,223,900 | 12/1965 | Wittwer ............................ | 357/75 |
| 3,320,497 | 5/1967 | Neuf ................................. | 357/75 |
| 3,489,960 | 1/1970 | Hudman ........................... | 357/75 |
| 3,648,121 | 3/1972 | Suenaga et al. ................... | 357/76 |
| 3,717,523 | 2/1973 | Dunsche .......................... | 357/79 |
| 3,846,823 | 11/1974 | Matthews ......................... | 357/75 |
| 4,007,477 | 2/1977 | Goodman ......................... | 357/72 |
| 4,063,348 | 12/1977 | Borden et al. .................... | 357/79 |

Primary Examiner—Andrew J. James
Attorney, Agent, or Firm—Frishauf, Holtz, Goodman & Woodward

[57] ABSTRACT

To improve the stability and robustness of a rectifier and to protect it against atmospheric influences, two semiconductor diodes in the shape of small plates or discs are disposed to hold between them a center electrode. A wire-like lead electrode is held in contact with the remaining side of one diode and the second lead electrode is cup-shaped and its walls surround the diode stack. An inwardly extending lip of the cup-shaped electrode supports a spring which exerts pressure on the enlarged tip of the first lead electrode, thus clamping the entire stack in contact. A cover plate seals the opening of the cup and a resinous mass may be applied over the cover plate to provide a hermetic seal.

1 Claim, 3 Drawing Figures

TWO SEMICONDUCTOR DIODE RECTIFIER STRUCTURE

This is a continuation of application Ser. No. 903,909 filed May 8, 1978, now abandoned.

FIELD OF THE INVENTION

The invention relates to rectifiers, especially of the type having two series-connected semiconductor diodes and a tap at their junction. The rectifiers are intended especially for use in rectifier bridge circuits associated with AC generators.

BACKGROUND OF THE INVENTION AND PRIOR ART

In a known rectifier of the general type referred to above, for example as described in the German Pat. No. 1 279 850, the tap electrode is composed of two parts between which are placed disc springs which press the semiconductor diodes against the lead conductors. The known device is not protected against atmospheric influences. Furthermore, the lead conductors are collective buses which include at least one further pair of electrodes, making this device impractical when only one pair of diodes is required.

SUMMARY OF THE INVENTION

It is a principal object of the invention to provide a rectifier composed of two series-connected solid state diodes which is a single unit of construction and may be used as such. It is a further object of the invention to provide a rectifier which is robust and from which the diodes cannot be easily removed. A still further object is to provide a rectifier which is protected against atmospheric influences. These and other objects are achieved according to the invention by providing that one of the lead electrodes is embodied as a cup-shaped member which envelops the rectifier structure on all sides but one and that the second lead electrode and the tap electrode enter the cup through the top and are wire-like in form. The stack of components is held within the cup by a spring which exerts axial pressure and which is supported by inward protrusions affixed to the cup. In a preferred embodiment, there is provided a cover plate and the cup is then covered with a plastic seal.

The invention will now be described by way of a preferred example with reference to the drawing.

DESCRIPTION OF THE PREFERRED EMBODIMENT

Figure 1:
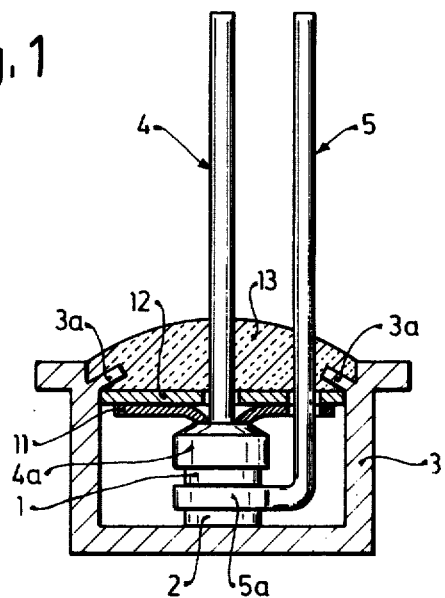
FIG. 1 is an axial section through the rectifier according to the invention.
Figure 2:
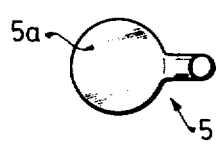
FIG. 2 is a top view of the tip of the center electrode.

FIG. 1 is an axial section through the rectifier according to the invention, showing first and second semiconductor plates 1 and 2 holding between them a tap electrode 5 having a flat end section 5a as shown separately in FIG. 2. Contacting the top surface of the diode 1 is the enlarged tip 4a of a lead electrode 4, substantially wire-like. The tap electrode 5 is bent as shown and extends substantially parallel to the electrode 4. A second lead electrode is placed in contact with the bottom of the diode 2 and is embodied as a unitary member 3, the sides of which substantially surround the stack of elements 1, 2, 4 and 5. The lead wires of electrodes 4 and 5 extend beyond the rim of the cup 3. Axial pressure is exerted on the stack of elements 1, 2, 4 and 5 by a spring member 11 which is supported on one side by an inward extension 3a of the rim of the cup 3 and which exerts its pressure on the head 4a of the electrode 4. A cover plate 12 is disposed between the extension 3a and the spring 11; it has a central hole permitting the passage of the electrode 4 and a further hole for the electrode 5. A plastic or resinous mass is applied to the top of the cup as a seal and its radial extent is defined by the rim of the cup. Each of the semiconductor elements 1 and 2 has at least one interior p-n junction extending substantially parallel to its flat outer surfaces and meeting the surface at the edge of the plate.

Figure 3:
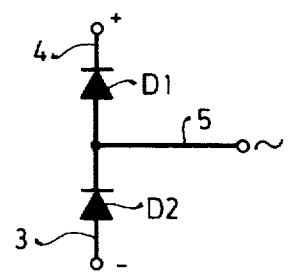
FIG. 3 is an electrical diagram of the rectifier according to the invention.

The electrical connection of the two semiconductor elements 1 and 2 is illustrated in FIG. 3, where they are designated as diodes D1 and D2, respectively. The diodes D1 and D2 are connected in the same electrical sense, the tap electrode 5 being connected to their junction.

We claim:

1. A unitary two-semiconductor diode full wave rectifier structure and assembly comprising
    first and second semiconductor diodes (1, 2) formed as plates or discs and connected in electrical series and geometrically stacked above each other in superposed alignment;
    a first electrode (5) comprising a flat disc-shaped portion (5a) and a wire-like lead portion,
    the disc-shaped portion being sandwiched between and aligned with said first and second diode plates or discs, the wire-like lead portion extending from the disc-shaped portion laterally of and essentially parallel to the alignment axis of the stack;
    a second electrode (4) having an enlarged head portion with an end face placed in contact with the side of said first diode (1) remote from said first electrode (5) and in alignment therewith and having a substantially wire-like connecting portion;
    a third electrode (3) comprising a unitary substantially cup-shaped element, and disposed to coaxially surround the stack formed by said plate or disc diodes and said first and second electrodes,
    the interior bottom wall of said third electrode (3) being in contact with the side of said second diode (2) remote from said first electrode (5);
    said third electrode (3) having an inwardly projecting lip;
    a spring (11) supported by said rim and exerting an axial force on the head portion (4a) of said second electrode in contact with the first diode, thereby holding said stack formed by the head portion of the second electrode and first diode (1), the flat, disc-shaped portion of said first electrode (5) between said diodes, and said second diode (2) in pressure-contact with the interior bottom wall of said third electrode (3);
    a seat (13) composed of a resinous mass applied to the top of said cup-shaped element (3) said seal sealing by embedding the lip of said electrode;
    and a cover plate (12) disposed between said inwardly extending rim or lip and said spring for covering the opening of said cup-shaped third electrode (3) and retaining said spring, and having apertures permitting the passage of the wire-like portions of said first and second electrodes (4,5).

* * * * *